(12) United States Patent
Eberhart

(10) Patent No.: US 7,649,382 B2
(45) Date of Patent: Jan. 19, 2010

(54) APPARATUS TO REDUCE VOLTAGE SWING FOR CONTROL SIGNALS

(75) Inventor: Hans Eberhart, Hermosa Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/586,670

(22) Filed: Oct. 26, 2006

(65) Prior Publication Data

US 2008/0030230 A1      Feb. 7, 2008

Related U.S. Application Data

(60) Provisional application No. 60/835,445, filed on Aug. 4, 2006.

(51) Int. Cl.
*H03K 19/0175* (2006.01)
*H03K 19/094* (2006.01)
*H03K 19/082* (2006.01)

(52) U.S. Cl. .................... 326/80; 326/62; 326/63; 326/64; 326/68; 326/75; 326/81

(58) Field of Classification Search .......... 326/80, 326/62–81
See application file for complete search history.

(56) References Cited

U.S. PATENT DOCUMENTS

| | | | | |
|---|---|---|---|---|
| 5,650,742 A | * | 7/1997 | Hirano | 327/333 |
| 6,242,962 B1 | * | 6/2001 | Nakamura | 327/333 |
| 7,265,583 B2 | * | 9/2007 | Hirano | 326/78 |
| 7,295,056 B2 | * | 11/2007 | Tanaka et al. | 327/333 |

* cited by examiner

*Primary Examiner*—Vibol Tan
*Assistant Examiner*—Matthew C Tabler
(74) *Attorney, Agent, or Firm*—Sterne, Kessler, Goldstein & Fox, P.L.L.C.

(57) ABSTRACT

The present invention provides for a device to reduce the voltage swing for control signals. An input signal with a maximum potential of DVDD and minimum potential of AVSS is level shifted to a maximum potential of AVDD and a minimum potential of AVDD-DVDD. A series of control signals are generated from the level shifted input signal by standard logic cells. The shifting of the input signal reduces the voltage swing for the control signals. These control signals are then used to drive a device operating at a potential of AVDD.

21 Claims, 12 Drawing Sheets

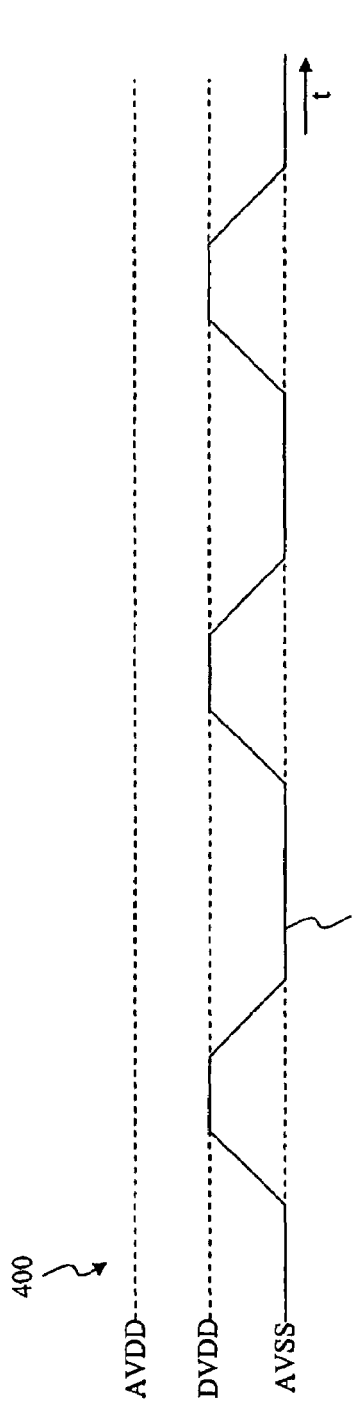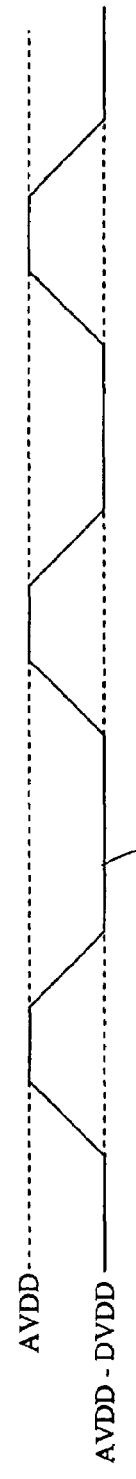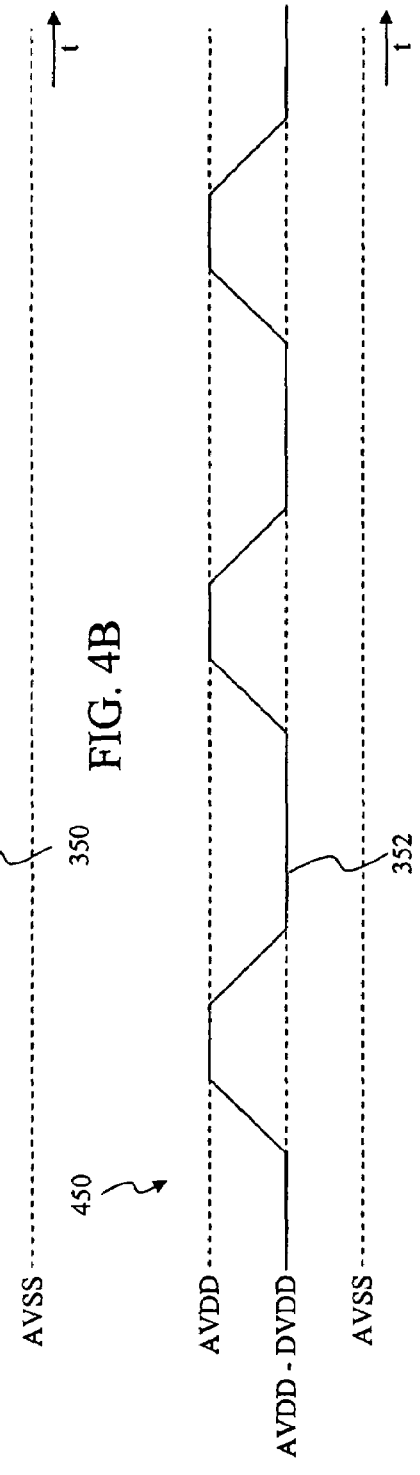

APPARATUS TO REDUCE VOLTAGE SWING FOR CONTROL SIGNALS

CROSS-REFERENCE TO RELATED APPLICATIONS

This patent application claims the benefit of U.S. Provisional Patent Application No. 60/835,445, filed Aug. 4, 2006, entitled "Apparatus and Method To Reduce Voltage Swing For Control Signals," which is incorporated herein by reference in its entirety.

BACKGROUND OF THE INVENTION

1. Field of the Invention

The present invention generally relates to control signals contained within integrated circuitry and more specifically the voltage swing of the control signals.

2. Background Art

A form of communication among neighboring circuits is required to interface connected circuits contained within an integrated circuit. This mode of communication is in the form of logic signals based on the binary number system. The two symbols most commonly chosen to represent the two logic values taken on by binary signals are 0 and 1. For example, a circuit where the magnitude of its signals equal to either AVSS or DVDD can be assigned the symbol 0 to correspond to AVSS and 1 to correspond to DVDD, where the potential DVDD is generally the supply voltage of the circuit and the potential AVSS generally has zero potential corresponding to ground. Each circuit can require a different logic signal level then its neighboring circuits. For example, a circuit may operate with a logic "1" corresponding to 1.2 volts. A logic "1" corresponding to 1.2 volts can be insufficient to interface a neighboring circuit. To enable the neighboring circuit to recognize the 1.2 volt signal as logic "1" requires an amplitude shift.

Techniques are available to translate the magnitude of signal levels. One currently available technique is through the use of an intermediate circuit. This intermediate circuit translates the potential of one circuit's corresponding logic "1" into the potential required by a neighboring circuit. Thus the translated signal will have the same potential at logic "0," ground, and the same potential at logic "1," the level required by the neighboring circuit. For example, for a circuit operating with a logic "1" corresponding to 1.2 volts and a neighboring circuit operating with a logic "1" corresponding to 3 volts, the intermediate circuit will translate the potential of the 1.2 volt logic "1" into the 3 volt logic "1" of the neighboring circuit.

The potential difference between the minimum potential (i.e., logic "0") and the maximum potential (i.e., logic "1") is known as the logic swing of a signal. Using this technique of translating logic "1" of one circuit into logic "1" of a neighboring circuit while leaving logic "0" at the same potential for both circuits, generates a signal with a large logic swing. In some cases this large logic swing is unnecessary to interface a neighboring circuit; a signal with a lower logic swing will suffice. Resultant from this large logic swing is an unnecessary dissipation in power.

What is needed is an intermediate circuit with a reduction in logic swing that addresses one or more of the aforementioned shortcomings of conventional interfacing devices.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

FIG. 4A illustrates a graphical representation of an input signal used to drive a control logic generator according to an embodiment of the present invention.

FIG. 4B illustrates a graphical representation of a level shifted input signal used to drive a digital to analog converter current source array according to an embodiment of the present invention.

FIG. 4C illustrates a graphical representation of a digital to analog converter control signal used to drive a digital to analog converter current source array according to an embodiment of the present invention.

Figure 7A:
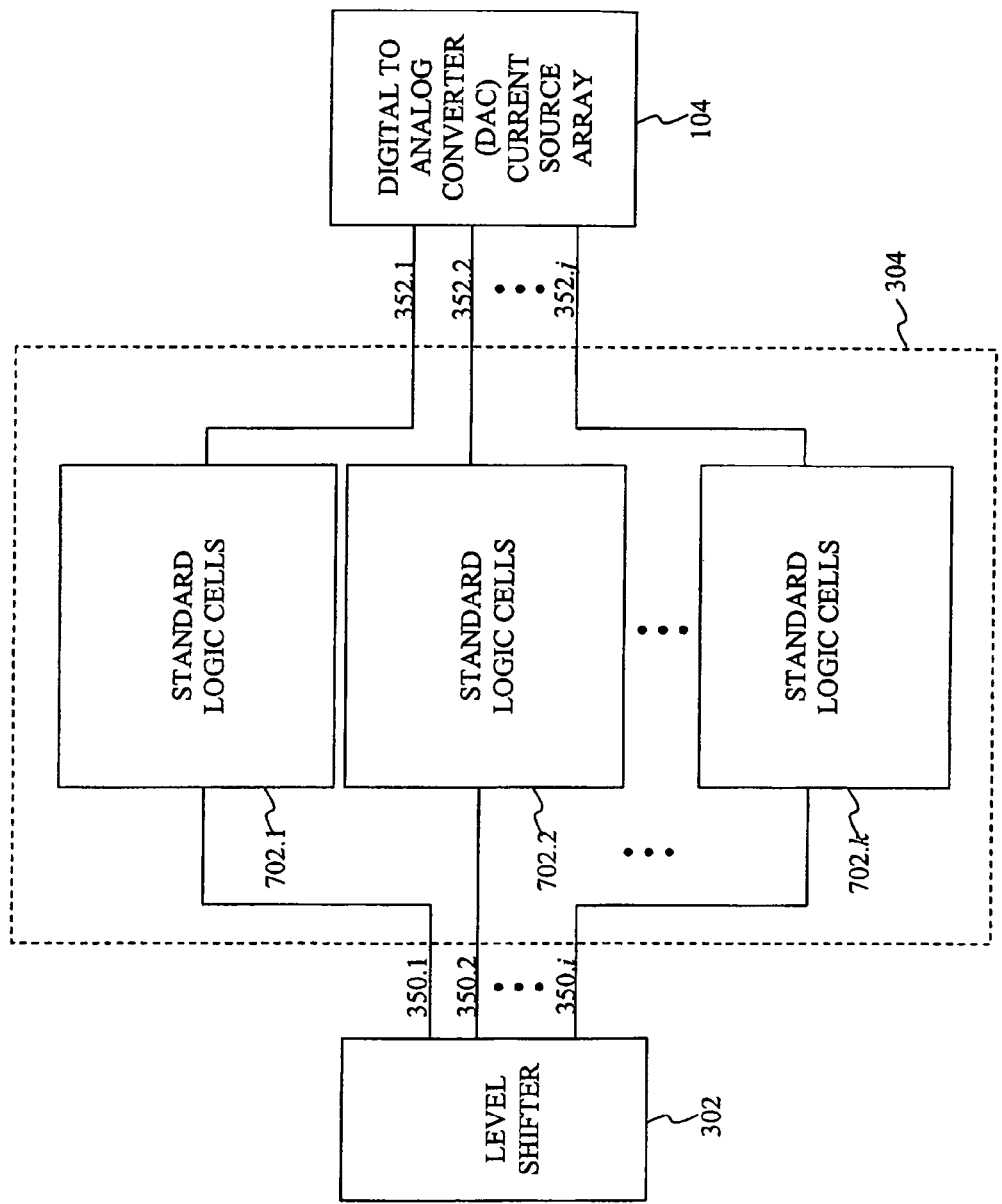
FIG. 7A illustrates a representation of a control logic generator for an interface used to drive a digital to analog converter current source array according to an embodiment of the present invention.
Figure 7B:
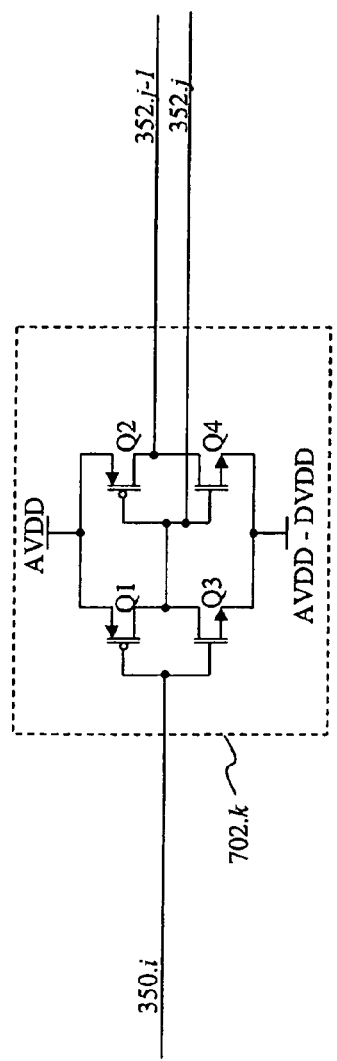
Figure 7C:
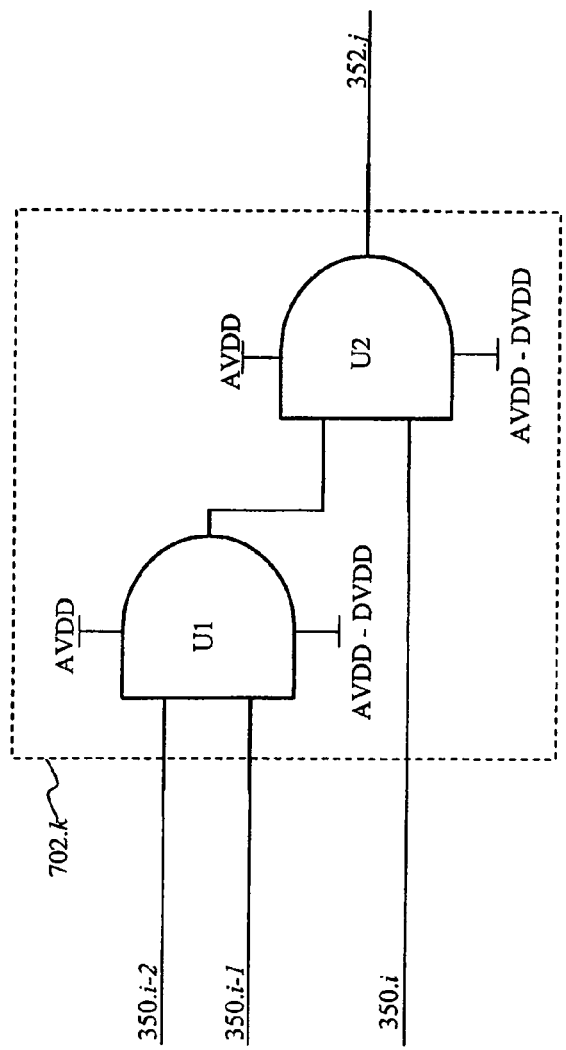

FIG. 7B illustrates a representation of a control logic generator cell in a control logic generator for an interface used to drive a digital to analog converter current source array according to an embodiment of the present invention FIG. 7C illustrates another representation of a control logic generator cell in a control logic generator for an interface used to drive a digital to analog converter current source array according to an embodiment of the present invention.

Figure 8:
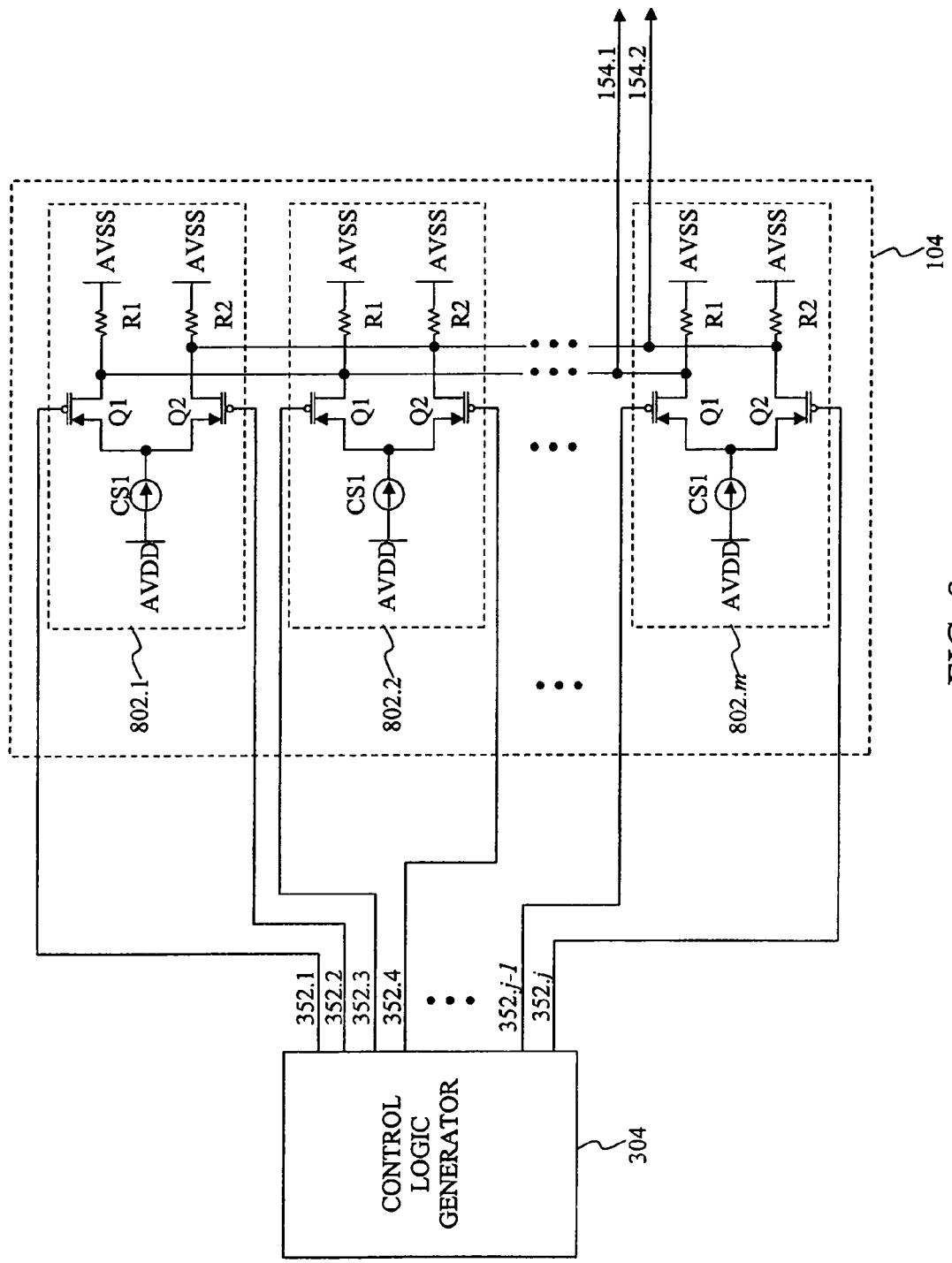

FIG. 8 illustrates a representation of a digital to analog converter current source array according to an embodiment of the present invention.

Figure 9:
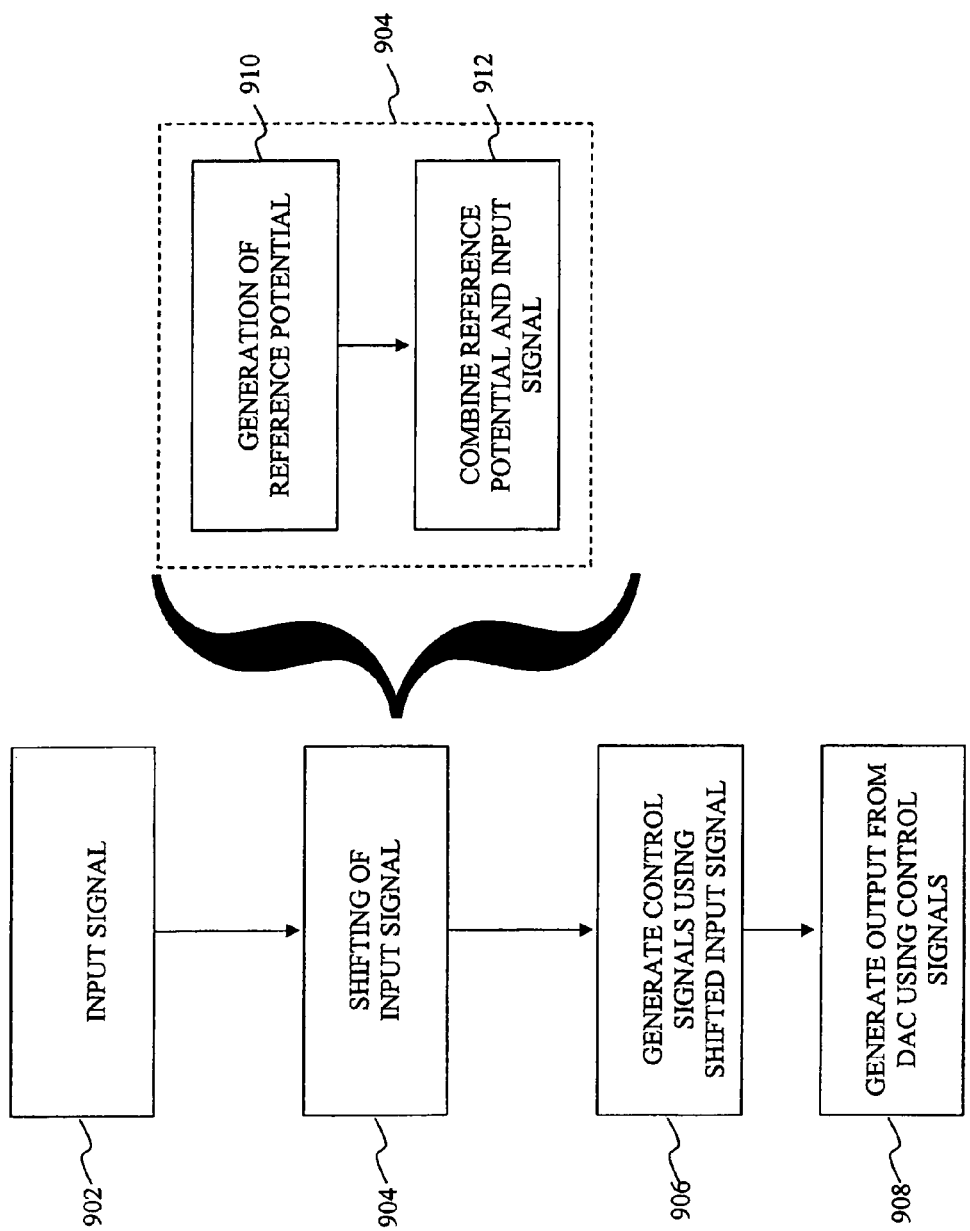

FIG. 9 illustrates a method to reduce the logic swing of control signals used to drive a digital to analog converter current source array according to an embodiment of the present invention.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

Figure 1:
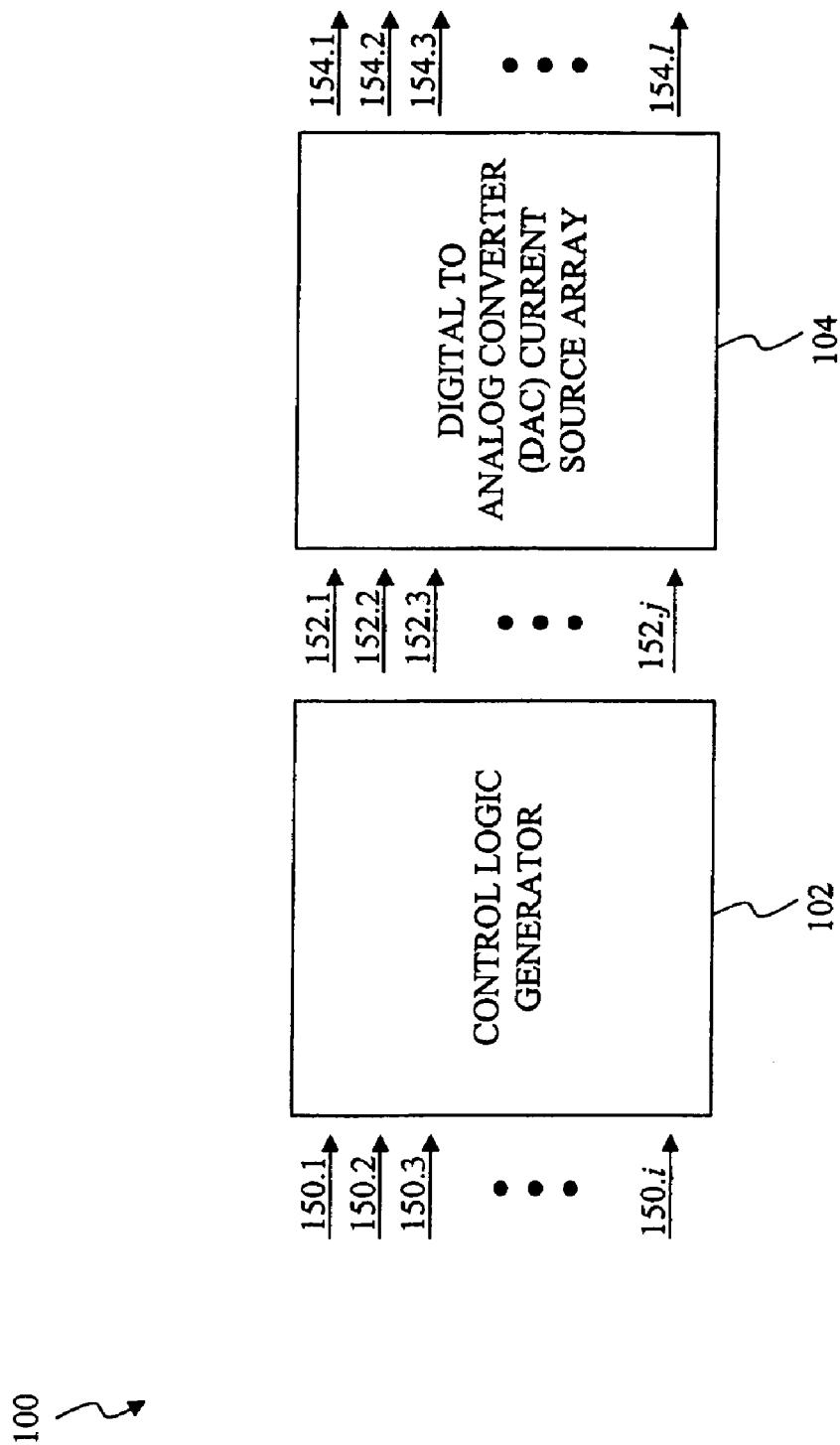
FIG. 1 illustrates a conventional interface used to drive a digital to analog converter current source array.

FIG. 1 illustrates a conventional interface used to drive a digital to analog converter current source array. Conventional interface 100 includes control logic generator 102 and digital to analog converter current source array 104. Control logic generator 102 produces digital to analog converter control signal 152 based upon input signal 150. Digital to analog converter current source array 104 uses digital to analog converter control signal 152 to form digital to analog converter output signal 154. Even though conventional interface 100 depicts control logic generator 102 with a digital to analog converter current source array, those skilled in the arts will understand that any suitable device may be used in conjunction with control logic generator 102.

Input signal 150 comprises of i separate and distinct signals denoted as 150.1 through 150.i. Herein, a reference to an element without a suffix corresponds to the collective grouping of that element. For example, a reference to 150 corresponds to elements 150.1 through 150.i. A reference to an element with a suffix corresponds to that element. For example, a reference to 150.i corresponds to the $i^{th}$ signal within the collective signal 150.

Control logic generator 102 transforms input signal 150, explained in further detail below in FIG. 2A, into j digital to analog converter control signals 152, denoted as 152.1 through 152.j. Digital to analog converter control signal 152 can contain a dissimilar number of signals than input signal 150. Multiple digital to analog converter control signals may be generated from a single input signal, or a single digital to analog converter control signal may be generated from numerous input signals. For example, for an input signal 150.1, control logic generator 102 can generate digital to analog converter control signals 152.1 and 152.2. As another example, for input signals 150.1 and 150.2, control logic generator 102 can generate digital to analog converter control signal 152.1 only.

Figure 2A:
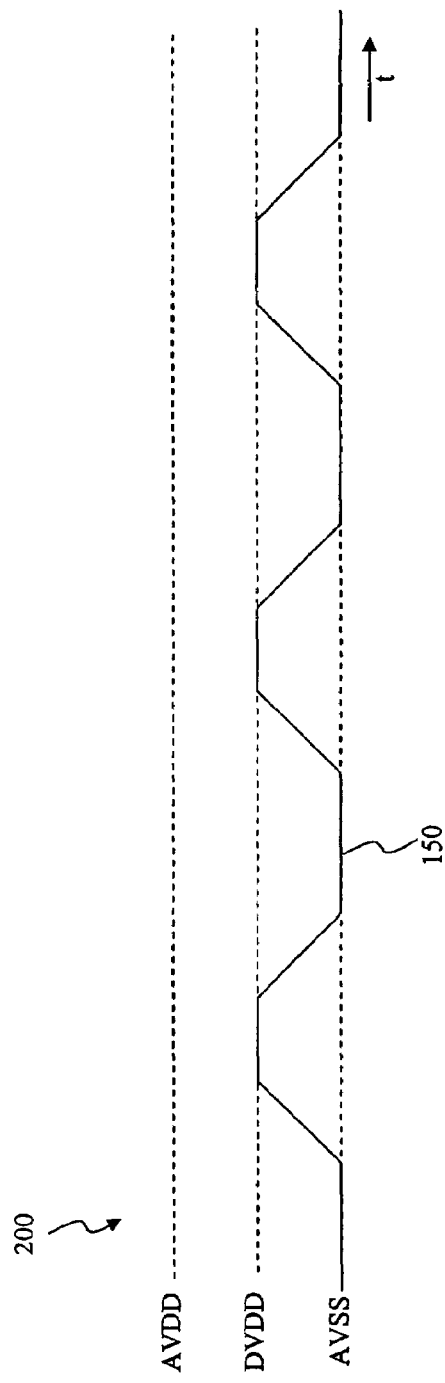
FIG. 2A illustrates a graphical representation of an input signal used in a conventional interface to drive a digital to analog converter current source array.
Figure 2B:
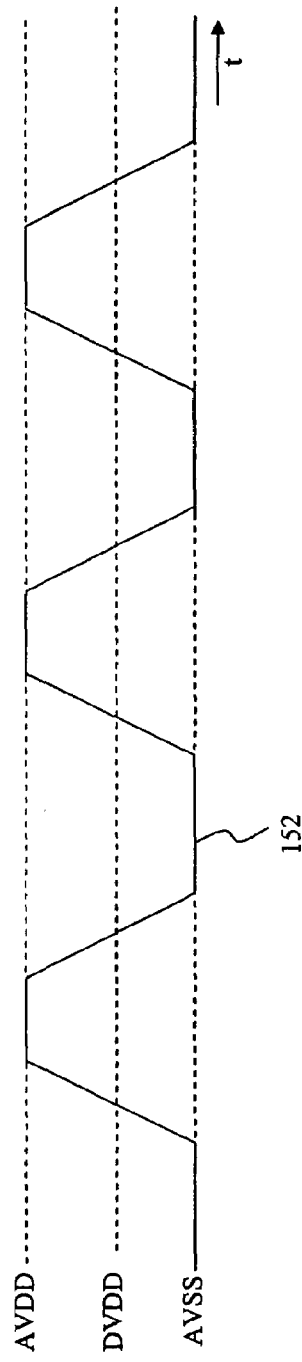
FIG. 2B illustrates a graphical representation of a digital to analog converter control signal used in a conventional interface to drive a digital to analog converter current source array.

Digital to analog converter control signal 152, explained in further detail below in FIG. 2B, is used by digital to analog converter current source array 104 to form l digital to analog converter output signal 154. Digital to analog converter output signal 154 is an analog signal generated by digital to analog converter current source array 104. Digital to analog converter output signal 154 can contain a dissimilar number of signals than digital to analog converter control signal 152. Varying numbers of digital to analog converter output signal 154 can be generated by a single digital to analog converter control signal 152. For example, for a digital to analog converter control signal 152.1, digital to analog converter current source array 104 can generate digital to analog output signals 154.1 and 154.2. As another example, for digital to analog converter control signal 152.1 and 152.2, digital to analog converter current source array 104 can generate digital to analog converter output signal 154.1 only.

FIG. 2A illustrates a graphical representation of an input signal used in a conventional interface to drive a digital to analog converter current source array. Graphical display 200 contains a time domain representation of a single signal from the collective input signal 150. Input signal 150 has a maximum potential of DVDD and a minimum potential of AVSS. Potential AVDD represents the maximum potential required to drive digital to analog converter current source array 104 and potential AVSS generally is zero potential corresponding to ground. Similar graphical illustrations can be made for each signal comprising input signal 150. The periodic nature of input signal 150 and the number of periods of input signal 150 displayed are for illustrative purposes only; the actual values are not required to have periodic tendencies.

Digital to analog converter control signal 152, explained in further detail below in FIG. 2B, is used by digital to analog converter current source array 104 to form l digital to analog converter output signal 154. Digital to analog converter output signal 154 is an analog signal generated by digital to analog converter current source array 104. Digital to analog converter output signal 154 can contain a dissimilar number of signals than digital to analog converter control signal 152. Varying numbers of digital to analog converter output signal 154 can be generated by a single digital to analog converter control signal 152. For example, for a digital to analog converter control signal 152.1, digital to analog converter current source array 104 can generate digital to analog output signals 154.1 and 154.2. As another example, for digital to analog converter control signal 152.1 and 152.2, digital to analog converter current source array 104 can generate digital to analog converter output signal 154.1 only.

Figure 3:
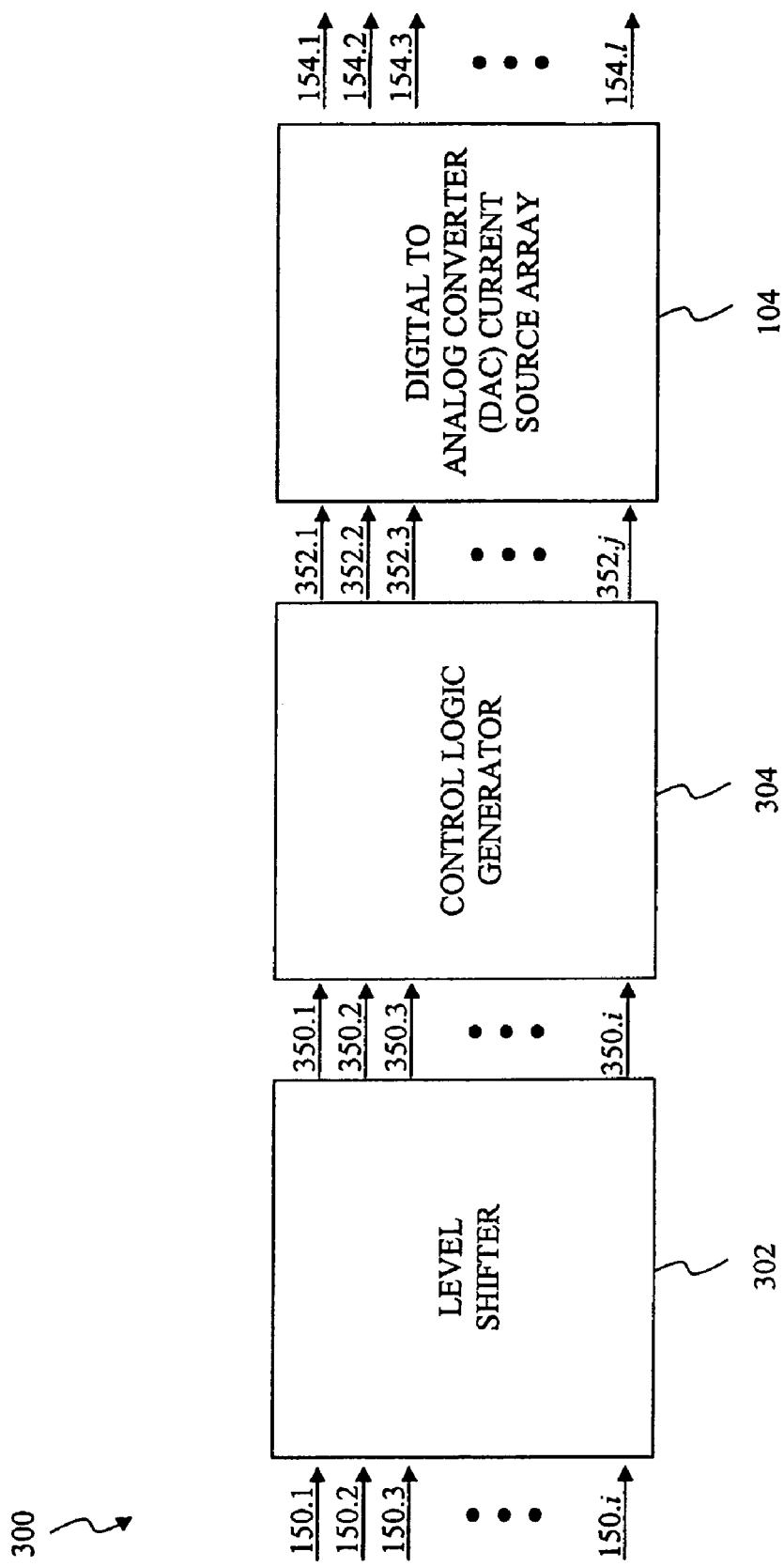
FIG. 3 illustrates an interface used to drive a digital to analog converter current source array according to an embodiment of the present invention.

FIG. 3 illustrates an interface used to drive a digital to analog converter current source array according to an embodiment of the present invention. Interface 300 contains level shifter 302, control logic generator 304, and digital to analog converter current source array 104. Level shifter 302 generates level shifted input signal 350 based upon input signal 150 to. Level shifted input signal 350 is then used by control logic generator 304 to form digital to analog converter control signal 352. Digital to analog converter current source array 104 uses digital to analog converter control signal 352 to form digital to analog converter output signal 154. Even though interface 300 depicts level shifter 302 and control logic generator 304 are coupled to a digital to analog converter current source array, those skilled in the arts will understand that any suitable device may be used in conjunction with level shifter 302 and control logic generator 304.

Level shifter 302 translates input signal 150 into i level shifted input signals 350 denoted as 350.1 through 350.i. A reference to level shifted input signal 350 corresponds to the collective signal, 350.1 through 350.i, while a reference containing a suffix refers to a specific input signal, for example, a reference to 350.i corresponds to the $i^{th}$ signal within the collective signal 350. Level shifted input signal 350 is explained in further detail below in FIG. 4B. Even though the number of signals that comprise input signal 150 is equal to the number of signals comprising level shifted input signals 350, this is for illustrative purposes only; an equality of signals is not required. For example, for input signal 150.1, level shifter 302 can generate level shifted input signals signal 350.1, as displayed in FIG. 3, or can generate digital to analog converter control signal 352.1 and 352.2 level shifted input signals 350.1 and 350.2.

FIG. 3 illustrates an interface used to drive a digital to analog converter current source array according to an embodiment of the present invention. Interface 300 contains level shifter 302, control logic generator 304, and digital to analog converter current source array 104. Level shifter 302 generates level shifted input signal 350 based upon input signal 150. Level shifted input signal 350 is then used by control logic generator 304 to form digital to analog converter control signal 352. Digital to analog converter current source array 104 uses digital to analog converter control signal 352 to form digital to analog converter output signal 154. Even though interface 300 depicts level shifter 302 and control logic generator 304 are coupled to a digital to analog converter current source array, those skilled in the arts will understand that any suitable device may be used in conjunction with level shifter 302 and control logic generator 304.

Digital to analog converter control signal 352 is used by digital to analog converter current source array 104 to form l digital to analog converter output signals 154. Digital to analog converter output signal 154 is an analog signal generated by digital to analog converter current source array 104 according to digital to analog converter control signal 352. Digital to analog converter output signal 154 can contain a dissimilar number of signals than digital to analog converter control signal 352. Varying numbers of digital to analog converter output signal 154 can be generated by a single digital to analog converter control signal 352. For example, for a digital to analog converter control signal 352.1, digital to analog converter current source array 104 can generate digital to analog output signals 154.1 and 154.2. As another example, for digital to analog converter control signal 352.1 and 352.2, digital to analog converter current source array 104 can generate digital to analog converter output signal 154.1 only.

FIG. 4A illustrates a graphical representation of an input signal used to drive a digital to analog converter current source array according to an embodiment of the present invention. Graphical display 400 contains a time domain representation of a single signal comprising input signal 150. Input signal 150 has a maximum potential of DVDD and a minimum potential of AVSS. Potential AVDD represents the maximum potential required to drive digital to analog converter current source array 104. Similar graphical illustrations can be made for each signal comprising input signal 150. The periodic nature of input signal 150 and the number of periods of input signal 150 displayed are for illustrative purposes only; the actual values are not required to be periodic in nature.

Digital to analog converter control signal 352 is used by digital to analog converter current source array 104 to form l digital to analog converter output signals 154. Digital to analog converter output signal 154 is an analog signal generated by digital to analog converter current source array 104 according to digital to analog converter control signal 352. Digital to analog converter output signal 154 can contain a dissimilar number of signals than digital to analog converter control signal 352. Varying numbers of digital to analog converter output signal 154 can be generated by a single digital to analog converter control signal 352. For example, for a digital to analog converter control signal 352.1, digital to analog converter current source array 104 can generate digital to analog output signals 154.1 and 154.2. As another example, for digital to analog converter control signal 352.1 and 352.2, digital to analog converter current source array 104 can generate digital to analog converter output signal 154.1 only.

FIG. 4C illustrates a graphical representation of a digital to analog converter control signal used to drive a digital to analog converter current source array according to an embodiment of the present invention. Graphical display 450 contains a time domain representation of a single signal comprising digital to analog converter control signal 352. As previously mentioned, control logic generator 304 operates upon level shifted input signal 350 to form digital to analog converter control signal 352. Digital to analog converter control signal 352 has substantially the same maximum and minimum potential as level shifted input signal 350. Similar graphical illustrations can be made for each signal comprising digital to analog converter control signal 352.

Even though digital to analog converter control signal 352 is shown to have the same periodicity of level shifted input signal 350, digital to analog converter control signal 352 need not exhibit these characteristics. For example, if a complementary control signal is necessary to interface digital to analog converter current source array 104, digital to analog converter control signal 352 can be phase shifted 180 degrees by control logic generator 304 to form a complementary representation of level shifted input signal 350. The periodic nature of digital to analog converter control signal 152, the number of periods of digital to analog converter control signal 152, and the correlation between digital to analog converter control signal 352 and level shifted input signal 350 as displayed are for illustrative purposes only; the actual values are neither required to be periodic in nature nor correlate with the input signal.

Figure 5A:
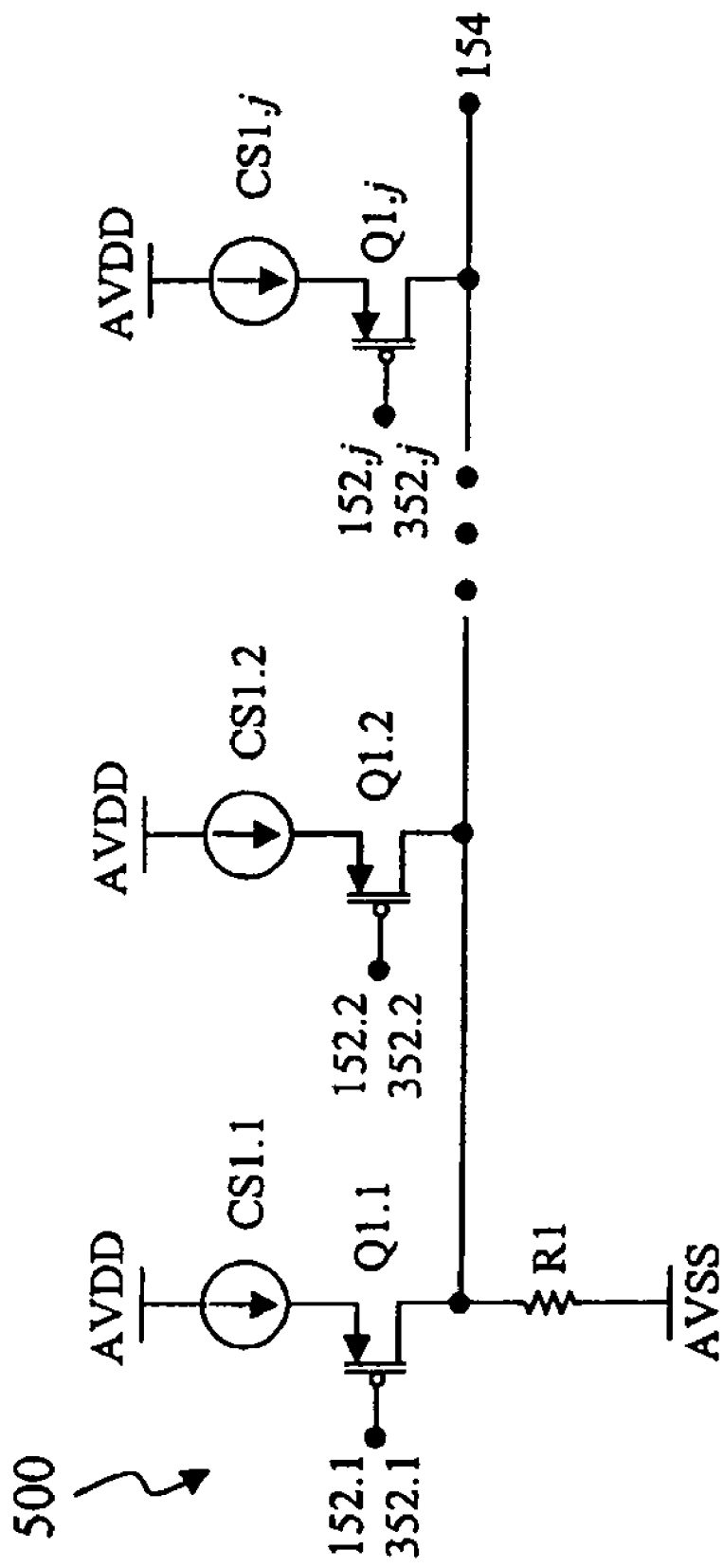
FIG. 5A illustrates a portion of an analog to digital converter according to an embodiment of the present invention.

FIG. 5A illustrates a portion of an analog to digital converter according to an embodiment of the present invention. Digital to analog converter current source array 104 may be implemented using PMOS switch 500. PMOS switch 500 contains j p-type metal oxide silicon (PMOS) transistors Q1.1 through Q1.*j*, each PMOS transistor includes a corresponding input either digital to analog converter control signal 152.1 through 152.*j* or digital to analog converter signal 352.1 through 352.*j* connected to the gate, a corresponding current source CS1.1 through CS1.*j* connected to the source, and a individual resistor R1 connected to the drain. In an exemplary embodiment, CS1.1 through CS1.*j* are of equal magnitude. As shown in FIG. 5A, PMOS switch 500 may produce digital to analog converter output signal 154 with either digital to analog converter control signal 152 or digital to analog converter signal 352.

The output of PMOS switch 500, denoted as digital to analog converter output signal 154, directly relates to the number of active transistors in PMOS transistor Q1.1 through Q1.*j*. For example, if a corresponding digital to analog converter signal 352 activates PMOS transistor Q1.1 and Q1.2, then digital to analog converter output signal 154 is substantially twice the product of the current source CS1 and the resistor R1. The gate to source voltage at which an individual PMOS transistor Q1.1 through Q1.*j* activates allowing current to flow from the source to the drain is called the threshold voltage. Generally the magnitude of the threshold voltage for PMOS transistor Q1 is less than or equal to DVDD. Resistor R1 is further connected to potential AVSS, which generally is zero potential corresponding to ground.

Figure 5B:
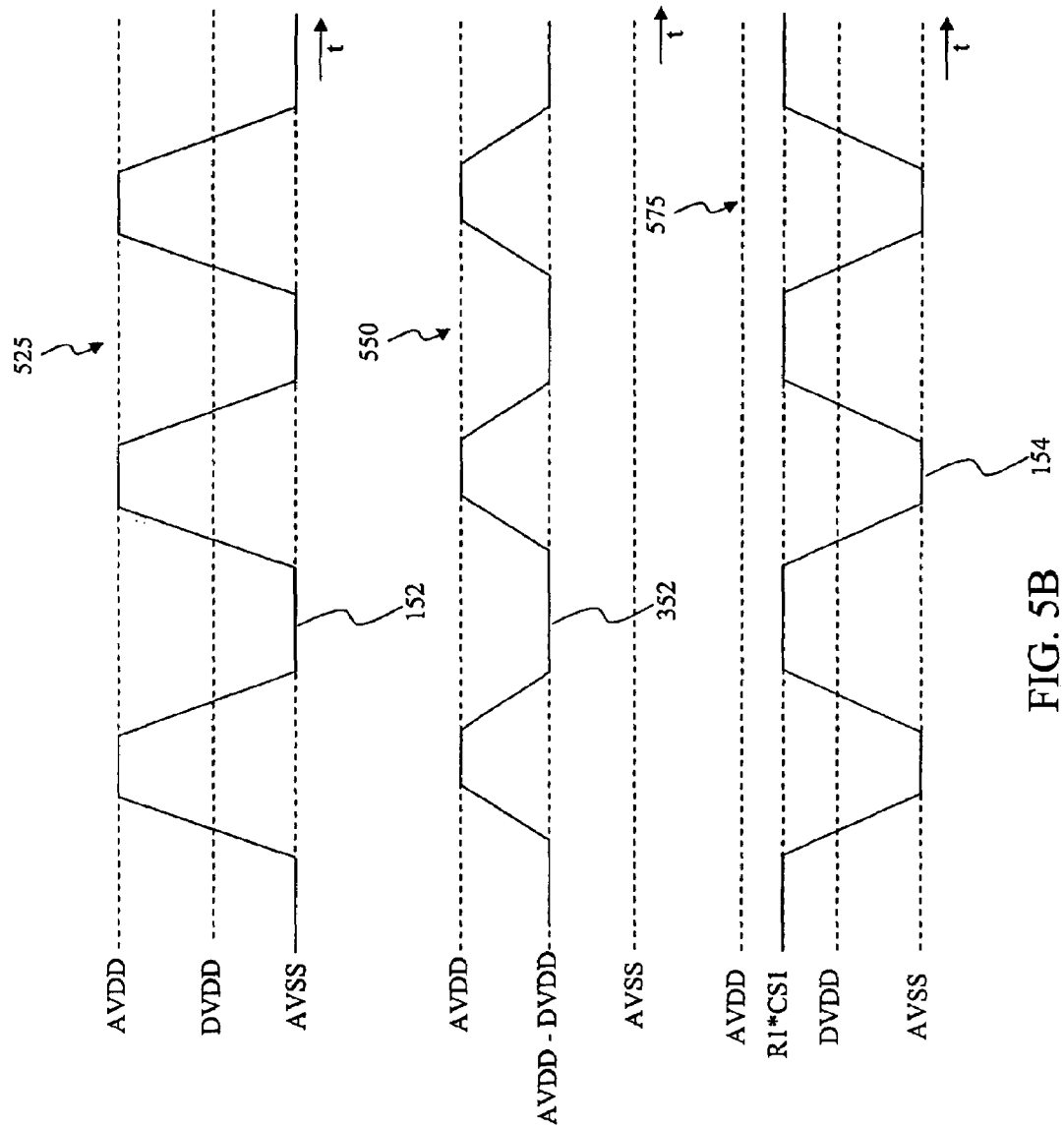
FIG. 5B illustrates a comparison of a level shifted control signal to a conventional control signal where both signals are applied to portion of an analog to digital converter according to an embodiment of the present invention.

FIG. 5B illustrates a comparison of a level shifted control signal to a conventional control signal where both signals are applied to portion of an analog to digital converter according to an embodiment of the present invention. The exemplary embodiment shown in FIG. 5B demonstrates the input-output relationship of a PMOS switch 500 having an individual PMOS transistor Q1.1 and an individual current source CS1.1. Graphical display 525 is an exemplary representation of digital to analog converter control signal 152, as previously presented in FIG. 2B. The periodic nature of digital to analog converter control signal 152 and the number of periods of digital to analog converter control signal 152 as displayed are for illustrative purposes only; the actual values are not required to exhibit periodic tendencies. Graphical display 550 is an exemplary representation of digital to analog converter signal 352 as previously presented in FIG. 4C. As shown, digital to analog converter control signal 352 has a similar periodicity as digital to analog converter control signal 152. The periodic nature of digital to analog converter control signal 352 and the number of periods of digital to analog converter control signal 352 as displayed are for illustrative purposes only; the actual values are not required to have periodic tendencies. Graphical display 575 shows a sample waveform corresponding to the output, denoted as digital to analog converter output signal 154, of PMOS switch 500 when either digital to analog converter signal 152 or digital to analog converter signal 352 is applies to the input of PMOS switch 500. In this exemplary embodiment, digital to analog converter output signal 154 has a maximum potential corresponding to the product of the current source CS1 and the resistor R1 with a maximum potential of AVSS and exhibits a similar periodic tendency as digital to analog converter control signal 152 and digital to analog converter control signal 352.

PMOS switch 500 may produce digital to analog converter output signal 154 with either digital to analog converter control signal 152 or digital to analog converter signal 352. As shown in FIG. 5B, digital to analog converter output signal 154 may be produced using digital to analog converter control signal 152 as the input for PMOS switch 500. When digital to analog converter control signal 152 is at its minimum potential, AVSS, the gate voltage applied to a corresponding PMOS transistor Q1.1 through Q1.j is negative with respect to the source by more than a threshold voltage. Current will flow from the source to the drain and the output of the corresponding PMOS transistor Q1.1 through Q1.j as measured across R1 is at its maximum potential, the product of R1 and CS1. On the other hand, when digital to analog converter control signal 152 is at its maximum potential, AVDD, the gate voltage applied to the corresponding PMOS transistor Q1.1 through Q1.j is not negative with respect to the source by more than a threshold voltage. No current will flow from the source to the drain and the output as measured across R1 is at its minimum potential, AVSS.

Digital to analog converter output signal 154 may also be produced using digital to analog converter control signal 352 as the input for PMOS switch 500 results. When digital to analog converter control signal 352 is at its minimum potential, AVDD-DVDD, the gate voltage applied to PMOS transistor Q1 is negative with respect to the source by more than a threshold voltage. Current will flow from the source to the drain and the output as measured across R1 is at its maximum potential, AVDD. On the other hand, when digital to analog converter control signal 352 is at its maximum potential, the product of R1 and CS1, the gate voltage applied to PMOS transistor Q1 is not negative with respect to the source by more than a threshold voltage. No current will flow from the source to the drain and the output as measured across R1 is at its minimum potential, AVSS. Therefore, digital to analog converter output signal 154 can be generated using either digital to analog converter control signal 152 or digital to analog converter control signal 352.

A comparison of digital to analog converter control signal 152 with digital to analog converter signal 352 shows a difference in logic swing. Logic swing is a measurement of the difference between the maximum potential and the minimum potential for a given signal. Digital to analog converter control signal 152 has a maximum potential of AVDD with a minimum potential of AVSS corresponding to a logic swing of AVDD-AVSS. On the other hand, digital to analog converter control signal 352 has a similar maximum potential of AVDD, but a minimum potential of AVDD-DVDD corresponding to a logic swing of DVDD. Since the potential at AVSS is less than the potential at AVDD and the potential at AVDD is less than the potential at DVDD, digital to analog converter control signal 352 exhibits less logic swing then digital to analog converter control signal 152. As demonstrated above, the potential level exhibited in digital to analog converter control signal 152 from AVSS to DVDD is not necessary to drive PMOS transistor Q1, thus the lesser logic swing of digital to analog converter control signal 352 nets an increase in power efficiency. Because AVDD-AVSS is greater than DVDD, a thicker oxide is required in fabricating PMOS transistor Q1. The advantages from using a thinner oxide can include lower gate capacitance, less propagation time, to provide some examples.

Figure 6A:
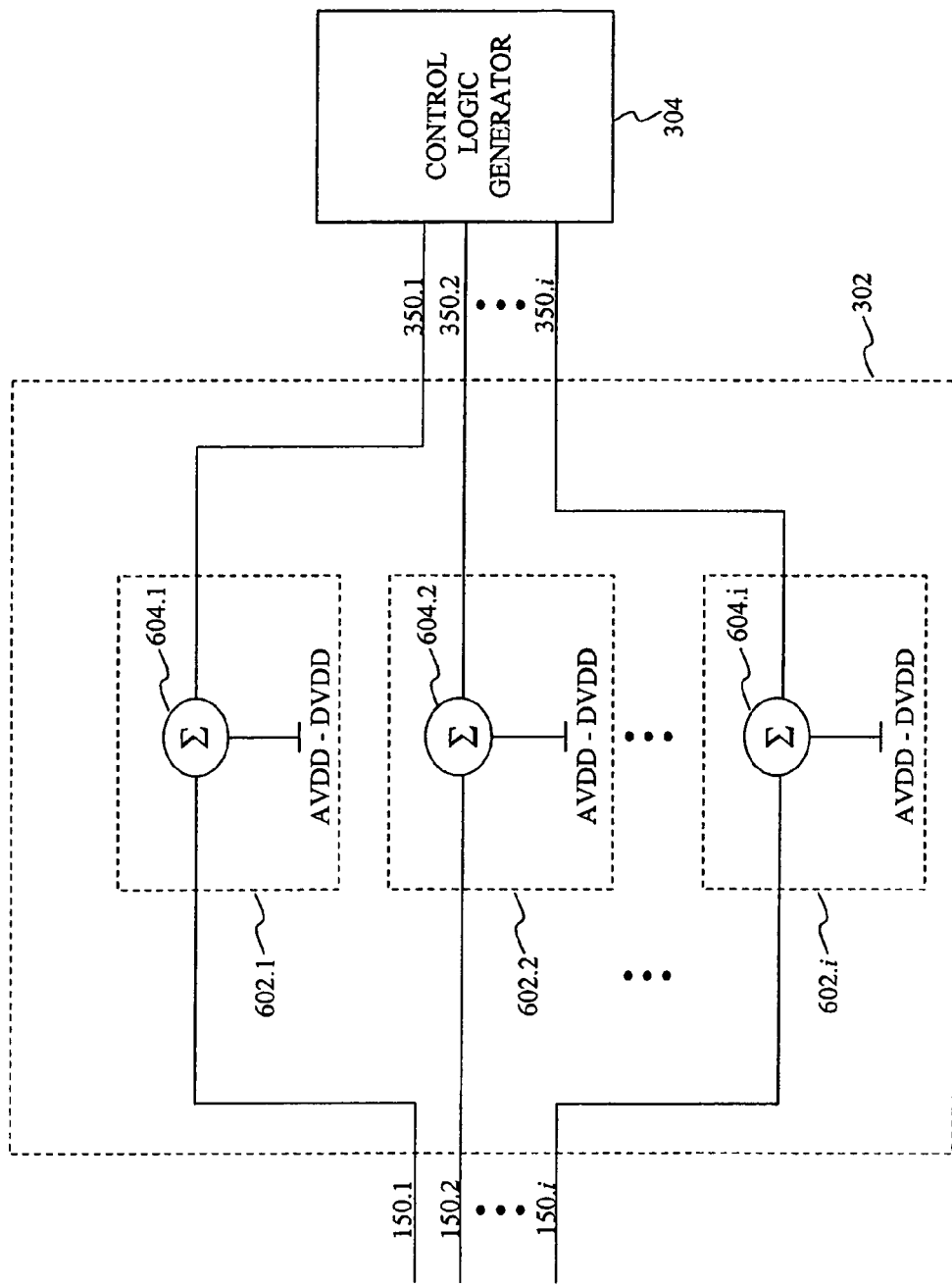
FIG. 6A illustrates a representation of a level shifter circuit for an interface used to drive a digital to analog converter current source array according to an embodiment of the present invention.

FIG. 6A illustrates a representation of a level shifter circuit for an interface used to drive a digital to analog converter current source array according to an embodiment of the present invention. Level shifter 302 combines input signal 150 with a reference potential AVDD-DVDD to generate level shifted input signal 350. Potential AVDD-DVDD can be generated by a voltage regulator or a precision voltage reference to provide some examples. Level shifted input signal 350 is then used by control logic generator 304.

Level shifter 302 comprises i level shifting cells 602.1 through 602.i. Each individual input signal 150.1 through 150.i has a corresponding level shifting cell 602.1 through 602.i to generate a corresponding level shifted input signal 350.1 through 350.i. An exemplary representation of a level shifting cell 602.i is shown below in FIG. 6B. Level shifting cell 602 uses summation circuits 604.1 through 604.i to combine input signal 150 with a reference potential AVDD-DVDD to raise the minimum potential of input signal 150 to AVDD-DVDD and the maximum potential of input signal 150 to AVDD. Those skilled in the arts will recognize that level shifting cell 602 may use any suitable means to raise the potential of input signal 150. This can include an operational amplifier, a transistor amplifier, or a passive network, to provide some examples.

Figure 6B:
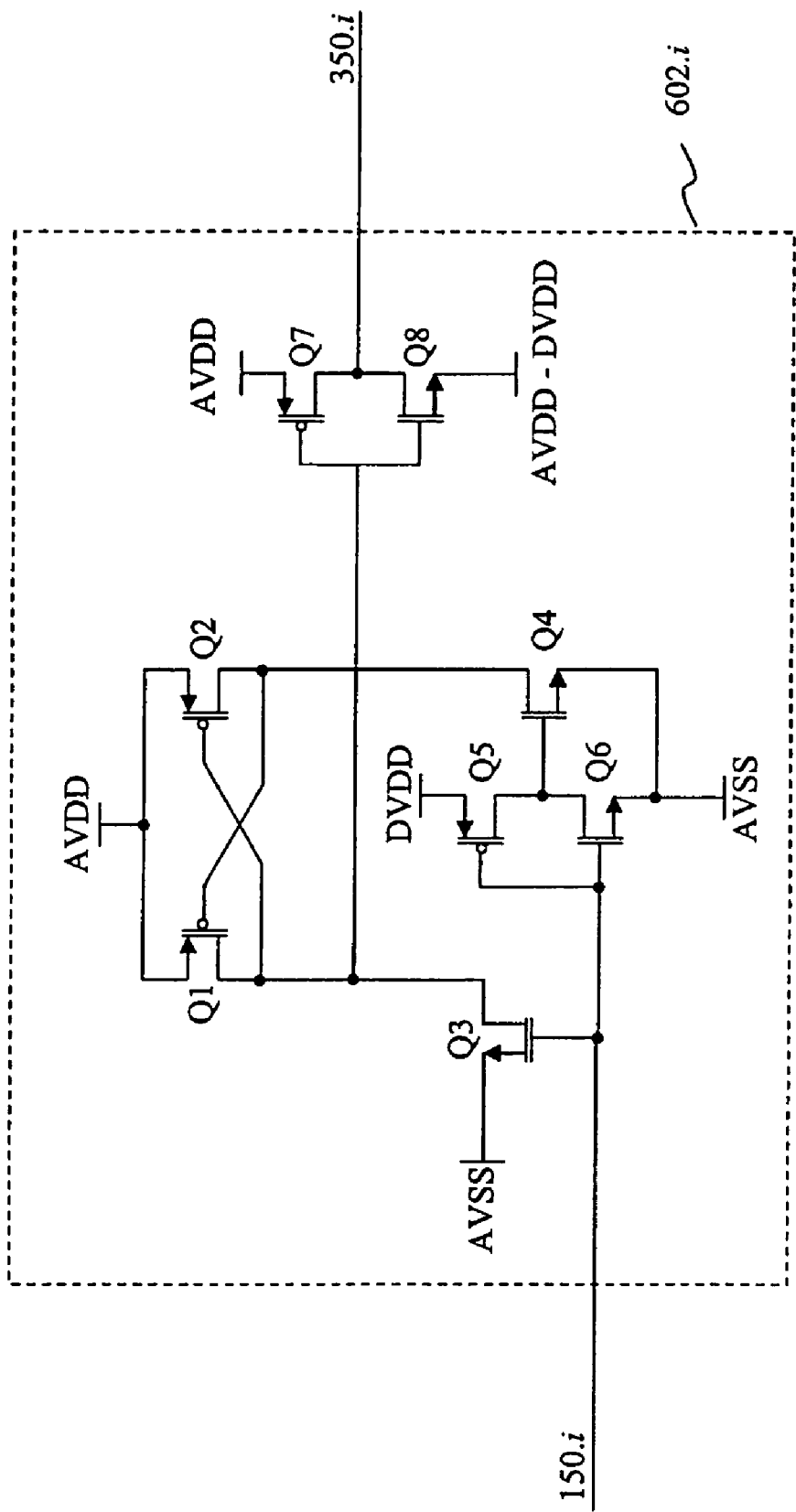
FIG. 6B illustrates a representation of a level shifting cell used in a level shifter circuit for an interface used to drive a digital to analog converter current source array according to an embodiment of the present invention.

FIG. 6B illustrates a representation of a level shifting cell used in a level shifter circuit for an interface used to drive a digital to analog converter current source array according to an embodiment of the present invention. This exemplary representation of level shifting cell 602.i combines input signal 150.i with a reference potential AVDD-DVDD to generate level shifted input signal 350.i.

Input signal 150.i is connected to the gate of n-type metal oxide silicon (NMOS) transistors Q3 and Q6 and to the gate of PMOS transistor Q5. The drain of transistor Q3 is connected to the drain of NMOS transistor Q1, the gate of PMOS transistor Q2, the gate of PMOS transistor Q7, and the gate of NMOS transistor Q8. The source of NMOS transistor Q3 is connected to potential AVSS which is generally has a potential of zero corresponding to ground. The source of PMOS transistor Q5 is connected to potential DVDD, whereas the drain of Q5 is connected to the drain of NMOS transistor Q6 and the gate of NMOS transistor Q4. The source of NMOS transistor Q6 and the source of NMOS transistor Q4 are connected to AVSS. The drain of NMOS transistor Q4 is connected to the drain of PMOS transistor Q2 and to the gate of PMOS transistor Q1. The source of PMOS transistor Q2, the source PMOS transistor Q1, and the source of PMOS transistor Q7 are connected to potential AVDD. The drain of PMOS transistor Q7 and the drain of NMOS transistor Q8 connect to the corresponding level shifted input signal 350.i. The source of NMOS transistor Q8 connects to the reference potential AVDD-DVDD.

When input signal 150.$i$, is at its maximum potential, DVDD, the gate voltage applied to NMOS transistor Q3 is positive with respect to the source by more than a threshold voltage. When the gate voltage applied to an NMOS transistor is positive with respect to the source by more than a threshold voltage, current will flow from the source to the drain. Therefore, current will flow from the source of NMOS transistor Q3 to the drain of NMOS transistor Q3.

PMOS transistor Q5 and NMOS transistor Q6 connect to form a CMOS inverter. Placement of potential DVDD at the input of the CMOS inverter, i.e., the gate of PMOS transistor Q5 and the gate of NMOS transistor Q6, results in a potential of AVSS at the output, i.e., the drain of PMOS transistor Q5 and the source of NMOS transistor Q6. The gate voltage applied to NMOS transistor Q6 is positive with respect to the source by more than a threshold voltage. Current will flow from the source of NMOS transistor Q6 to the drain of NMOS transistor Q6. The gate voltage applied to PMOS transistor Q5 is not negative with respect to the source by more than a threshold voltage. No current will flow from the source of PMOS transistor Q5 to the drain of PMOS transistor Q5. Similarly, a potential of AVSS, on the input of the CMOS inverter results in a potential DVDD at its output. Therefore, when input signal 150.$i$, is at its maximum potential, DVDD, a potential of AVSS, is generated at the output of the Q5-Q6 CMOS inverter.

As a result, the gate voltage applied to NMOS transistor Q4 is not positive with respect to the source by more than a threshold voltage, thereby no current will flow from the source of NMOS transistor Q4 to the drain of NMOS transistor Q4. Because current will flow from the source of NMOS transistor Q3 to the drain of NMOS transistor Q3, the gate voltage applied to PMOS transistor Q2 is negative with respect to the source by more than a threshold voltage allowing current to flow from the source of PMOS transistor Q2 to the drain of PMOS transistor Q2. The current flowing through the source of PMOS transistor Q1 to the drain of PMOS transistor Q2 will cause the gate voltage applied to PMOS transistor Q1 not to be negative with respect to the source by more than a threshold voltage. No current will flow from the source of PMOS transistor Q1 to the drain of PMOS transistor Q1.

As with PMOS transistor Q5 and NMOS transistor Q6, PMOS transistor Q7 and NMOS transistor Q8 is connected to form a CMOS inverter. A potential of AVSS is applied to the gate of PMOS transistor Q7 and to the gate of NMOS transistor Q8. Current will flow from the source of PMOS transistor Q7 to the drain of PMOS transistor Q7 generating an output with a potential of AVDD at the output of the Q7-Q8 CMOS inverter. This generated output corresponds to level shifted input signal 350.$i$ when input signal 150.$i$ is at its maximum potential of DVDD.

When input signal 150.$i$, is at its minimum potential, 0 volts, the gate voltage applied to NMOS transistor Q3 is not positive with respect to the source by more than a threshold voltage. No current will flow from the source of NMOS transistor Q3 to the drain of NMOS transistor Q3. In addition, when input signal 150.$i$, is at its minimum potential, AVSS, a potential of DVDD is generated at the output of the Q5-Q6 CMOS inverter.

As a result, the gate voltage applied to NMOS transistor Q4 is positive with respect to the source by more than a threshold voltage. Current will flow from the source of NMOS transistor Q4 to the drain of NMOS transistor Q4. Because no current will flow from the source of NMOS transistor Q3 to the drain of NMOS transistor Q3, the gate voltage applied to PMOS transistor Q2 is not negative with respect to the source by more than a threshold voltage. No current will flow from the source of PMOS transistor Q2 to the drain of PMOS transistor Q2. The current flowing through the source of PMOS transistor Q2 to the drain of PMOS transistor Q2 will cause the gate voltage applied to PMOS transistor Q1 to be negative with respect to the source by more than a threshold voltage. Current will flow from the source of PMOS transistor Q1 to the drain of PMOS transistor Q1. Therefore a potential of AVDD is applied to the gate of PMOS transistor Q7 and to the gate of NMOS transistor Q8. Current will flow from the source of PMOS transistor Q8 to the drain of PMOS transistor Q8 generating an output with a potential of AVDD-DVDD. This generated output corresponds to level shifted input signal 350.$i$ when input signal 150.$i$ is at its minimum potential.

FIG. 7A illustrates a representation of a control logic generator for an interface used to drive a digital to analog converter current source array according to an embodiment of the present invention. Control logic generator 304 uses control logic generator cells 702 to produce digital to analog converter control signal 352 from level shifted input signal 350. Digital to analog converter control signal 352 is then used to drive digital to analog converter current source array 104.

Control logic generator 304 comprises k control logic generator cells 702.1 through 702.$k$ to generate j digital to analog converter control signals 352.1 through 352.$j$. Multiple digital to analog converter control signals can be generated from a single input signal, or a single digital to analog converter control signal can be generated from numerous input signals. For example, for a level shifted input signal 350.1, control logic generator 102 can generate digital to analog converter control signals 352.1, and 352.2. As another example, for level shifted input signals 350.1 and 350.2, control logic generator 102 can generate digital to analog converter control signal 352.1 only. Control logic generator cell 702 can be implemented using standard logic cells that are pre-defined and characterized, such as logic gates, flip-flops, or transistors to provide some examples. The standard logic cells may be implemented according to a binary algorithm, examples of which are shown in FIG. 7B and FIG. 7C.

FIG. 7B illustrates a representation of a control logic generator cell in a control logic generator for an interface used to drive a digital to analog converter current source array according to an embodiment of the present invention In this exemplary embodiment, control logic generator cell 702.$k$ utilizes level shifted input signal 350.$i$ to generate digital to analog converter control signal 352.($j$−1) and digital to analog converter control signal 352.$j$. PMOS transistor Q1 and NMOS transistor Q3 are arranged to form a standard logic CMOS inverter. The gate of PMOS transistor Q1 and gate of NMOS transistor Q3 are connected to a corresponding level shifted input signal 350.$i$. PMOS transistor Q1 and NMOS transistor Q3 are arranged to form a standard logic CMOS inverter. The drain of PMOS transistor Q1 is connected to the drain of NMOS transistor Q3. The source of PMOS transistor Q1 is connected to AVDD while the source of NMOS transistor Q3 is connected to AVDD-DVDD.

PMOS transistor Q2 and NMOS transistor Q4 are also arranged to form a standard logic CMOS inverter. The gate of PMOS transistor Q2 and gate of NMOS transistor Q4 are connected to the drain of PMOS transistor Q1 and the drain of NMOS transistor Q3 and to a corresponding digital to analog converter control signal 352.$j$−1. The source of PMOS transistor Q2 is connected to AVDD while the source of NMOS transistor Q4 is connected to AVDD-DVDD. The drain of PMOS transistor Q2 is connected to the drain of NMOS transistor Q4 and to a corresponding digital to analog converter control signal 352.$j$.

When the level shifted input signal 350.*i* is at its maximum potential AVDD, current flows through NMOS transistor Q3, no current will flow through PMOS transistor Q1. The potential at the drain of PMOS transistor Q1 and at the drain of NMOS transistor Q3 when referenced to ground will be AVDD-DVDD. When level shifted input signal 350.*i* is at its minimum potential of AVDD-DVDD, current flows through PMOS transistor Q1, no current will flow through NMOS transistor Q3. The potential at the drain of PMOS transistor Q1 and at the drain of NMOS transistor Q3 will be at potential AVDD. The corresponding signal at the drain of PMOS transistor Q1 and source of NMOS transistor Q3 is applied to the gate of PMOS transistor Q2 and to the gate of NMOS transistor Q4. When the level shifted input signal 350.*i* is at its maximum potential AVDD, the potential at the drain of PMOS transistor Q1 and drain of NMOS transistor Q3 will be at its minimum potential AVDD-DVDD, therefore current will flow through PMOS transistor Q2. No current will flow through NMOS transistor Q4. The potential at the drain of PMOS transistor Q1 and at the drain of NMOS transistor Q3 will be potential AVDD. When the level shifted input signal 350 is at its minimum potential AVDD-DVDD, the potential at the drain of PMOS transistor Q1 and at the drain of NMOS transistor Q3 will be at its maximum potential AVDD, therefore current will flow through NMOS transistor Q4, no current will flow through PMOS transistor Q2. The potential at the drain of PMOS transistor Q2 and at the drain of NMOS transistor Q4 when referenced to ground will be AVDD-DVDD. In this exemplary embodiment, level shifted input signal 350.*i* corresponds to two complementary digital to analog converter control signals 352.*j*-1 and 352.*j*.

FIG. 7C illustrates another representation of a control logic generator cell in a control logic generator for an interface used to drive a digital to analog converter current source array according to an embodiment of the present invention.

In this exemplary embodiment, control logic generator cell 702.*k* utilizes level shifted input signal 350.*i*-2, level shifted input signal 350.*i*-1, and level shifted input signal 350.*i* to generate digital to analog converter control signal 352.*j*. AND gate U1 is a standard two input logic AND gate with level shifted input signal 350.*i*-2 connected to one input and level shifted input signal 350.*i*-1 connected to the other. The output of AND gate U1 is then connected to AND gate U2, another standard two input logic AND gate whose other input is level shifted input signal 350.*i*. The output of AND gate U2 is connected to a corresponding digital to analog converter control signal 352.*j*. Both AND gate U1 and AND gate U2 are connected to potentials AVDD and AVDD-DVDD.

AND gate U1 and AND gate U2 are standard two input logic AND gates constructed using both NMOS and PMOS transistors to create a CMOS implementation. AND gate U1 will output its maximum potential, AVDD, when level shifted input signal 350.*i*-2 is at its maximum potential of AVDD and level shifted input signal 350.*i*-1 is at its maximum potential of AVDD. If either level shifted input signal 350.*i*-2 or level shifted input signal 350.*i*-1 is at its minimum potential of AVDD-DVDD, the potential at the output of AND gate U1 will be at its minimum of AVDD-DVDD. AND gate U2 will output its maximum potential, AVDD, when the output of AND gate U1 is at its maximum potential of AVDD and level shifted input signal 350.*i* is at its maximum potential of AVDD. If either the output of AND gate U1 or level shifted input signal 350.*i* is at its minimum potential of AVDD-DVDD, the potential at the output of AND gate U2 will be at its minimum of AVDD-DVDD. The output of AND gate U2 corresponds to digital to analog converter control signal 352.*j*.

FIG. 8 illustrates a representation of a digital to analog converter current source array according to an embodiment of the present invention. Digital to analog converter current source array 104 uses digital to analog converter control signal 352 generated by control logic generator 304 to produce digital to analog converter output signal 154. In this exemplary embodiment, digital to analog converter output 154 comprises; 154.1 and 154.2; those skilled in the arts will recognize that digital to analog converter output 154 can comprise any suitable number of signals.

Digital to analog converter current source array 104 comprises m digital to analog converter current source cells 802.1 through 802.*m* to generate digital to analog converter outputs 154.1 and 154.2. Digital to analog converter current source cells 802 as displayed is for illustrative purposes; those skilled in the arts will recognize that each digital to analog converter current source cell 802 need not be identical replications. Digital to analog converter current source cell 802 contains current source CS1, PMOS transistor Q1 and Q2, and resistors R1 and R2. Current source CS1 is connected to AVDD on one end and to the source of PMOS transistor Q1 and the source of PMOS transistor Q2 on the other. The gate of Q1 is connected to a corresponding digital to analog converter control signal 352 while the gate of Q2 is connected to an adjacent corresponding digital to analog converter control signal 352. R1 and R2 are both connected to potential AVSS on one end. The other end of R1 is connected to the drain of Q1, while the other end of R2 is connects to the drain of Q2.

Digital to analog converter output 154.1 is current sourced by transistor Q1 while digital to analog converter output 154.2 is current sourced by transistor Q2. In this exemplary embodiment, all the current sourced by transistor Q1 is summed into digital to analog converter output signal 154.1 and all the current sourced by transistor Q2 is summed into digital to analog converter output signal 154.2. In this exemplary embodiment, digital to analog converter control signal 352.1 through 352.*j* comprises j/2 complementary pairs; those skilled in the arts will recognize that digital to analog converter control signal 352 need not be complementary in nature. When the digital to analog converter control signal 352 connected to gate Q1 is at its maximum potential AVDD, the corresponding complementary digital to analog control signal 352 connected to gate Q2 is at its minimum potential AVDD-DVDD. Q2 will activate thereby allowing current source CS1 to contribute to digital to analog converter output signal 154.2. No current will flow through Q1; therefore, CS1 does not contribute to digital to analog converter output 154.1. When the digital to analog converter control signal 352 connected to gate Q1 is at its minimum potential AVDD-DVDD, the corresponding complementary digital to analog control signal 352 connected to gate Q2 is at its maximum potential AVDD. Q1 will activate thereby allowing current source CS1 to contribute to digital to analog converter output signal 154.1. No current will flow through Q2; therefore, CS1 does not contribute to digital to analog converter output 154.2.

FIG. 9 illustrates a method to reduce the logic swing of control signals used to drive a digital to analog converter current source array according to an embodiment of the present invention.

Input signal 902 is a signal with a maximum potential of DVDD and a minimum potential of 0 volts. In general, input signal 902 can contain a grouping of signals consisting of multiple individual signals.

The shifting of the input signal, denoted as 904, comprises the steps of generation of reference potential, denoted as 910, and combining reference potential and input signal, denoted as 912. The reference potential generated in 910 has a magnitude of AVDD-DVDD where AVDD is the supply voltage of the circuit which the input signal is to drive. Combination of the input signal 902 and the reference potential of step 910, denoted as 912, raises input signal 902 to a maximum potential of AVDD and a minimum potential of AVDD-DVDD.

Generation of control signals, denoted as 906, uses standard logic cells to generate a control signal from the level shifted input signal generated in 904. The control signals generated in 906 have a similar maximum potential of AVDD and a similar minimum potential of AVDD-DVDD as the level shifted input signal.

Generation of output of digital to analog converter current source, denoted as 908, uses the control signals generated in 906 to drive a digital to analog current source array. Even though the control signals are used to drive a digital to analog current source array, those skilled in the arts will understand that any suitable device may be used in conjunction the generated control signals.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. An apparatus to reduce logic swing, comprising:
   a level shifting device including a reference potential, configured to translate a first maximum potential of an input signal to a second maximum potential and to translate a minimum potential of the input signal to the reference potential to form a level shifted input signal, wherein the reference potential is substantially equal to a difference between the first maximum potential and the second maximum potential;
   a control logic generator coupled to the level shifting device configured to generate a control signal in response to the level shifted input signal, wherein a minimum potential of the control signal is substantially equal to the reference potential and a maximum potential of the control signal is substantially equal to the second maximum potential;
   a current source configured to provide a current to an output; and
   a PMOS transistor, coupled between the current source and the output, configured to couple the current to the output when the control signal is substantially equal to the reference potential and to cutoff the current to the output when the control signal is substantially equal to the second maximum potential.

2. The apparatus of claim 1, wherein the level shifting device comprises:
   a summing circuit configured to combine the reference potential with the input signal to raise the minimum potential of the input signal to the reference potential and the maximum potential of the input signal to the second maximum potential.

3. The apparatus of claim 1, wherein the control logic generator comprises:
   a plurality of control logic generator cells including at least one standard logic cell configured to implement a binary algorithm.

4. The apparatus of claim 1, wherein the level shifting device comprises:
   a first inverting circuit, coupled to the second maximum potential and the reference potential, configured to translate the first maximum potential of the input signal to the second maximum potential and the minimum potential of the input signal to the reference potential; and
   a first transistor configured to cause the first inverting circuit to translate the first maximum potential of the input signal to the second maximum potential when the input signal is substantially equal to the first maximum potential.

5. The apparatus of claim 4, wherein the first transistor provides the minimum potential to the first inverting circuit when the input signal is substantially equal to the first maximum potential.

6. The apparatus of claim 4, wherein the level shifting device further comprises:
   a second inverting circuit, coupled the first maximum potential and the minimum potential, configured to translate the first maximum potential of the input signal to the minimum potential and the minimum potential of the input signal to the first maximum potential; and
   one or more second transistors arranged in circuit to cause the first inverting circuit to translate the minimum potential of the input signal to the reference potential when an output of the second inverting circuit is substantially equal to the first maximum potential.

7. The apparatus of claim 6, wherein the one or more second transistors comprise:
   a third transistor, coupled to the second inverting circuit, configured to provide the minimum potential when the output of the second inverting circuit is substantially equal to the first maximum potential; and
   a fourth transistor, coupled to the third transistor, configured to provide the second maximum potential to the first inverting circuit based when an output of the third is substantially equal to the minimum potential.

8. The apparatus of claim 1, wherein the control logic generator is configured to generate a second control signal in response to the level shifted input signal, the second control signal being a complement of the first control signal, wherein a minimum potential of the second control signal is substantially equal to the reference potential and a maximum potential of the second control signal is substantially equal to the second maximum potential.

9. The apparatus of claim 8, wherein the control logic generator comprises:
   a first inverting circuit, coupled to the second maximum potential and the reference potential, configured to provide the second control signal based upon the level shifted input signal; and
   a second inverting circuit, coupled to the second maximum potential and the reference potential, configured to provide the first control signal based upon an output of the first inverting circuit.

10. The apparatus of claim 7, further comprising:
    a second PMOS transistor configured to couple the current to a second output when the second control signal is substantially equal to the reference potential and to cutoff the current to the second output when the second control signal is substantially equal to the second maximum potential.

11. An apparatus to interface one or more p-type metal oxide semiconductor (PMOS) transistors using a reduced logic swing, comprising:
- a level shifting device including a reference potential configured to translate a first maximum potential of an input signal to a second maximum potential and a minimum potential of the input signal to the reference potential, the reference potential being substantially equal to a difference between the first maximum potential and the second maximum potential;
- a control logic generator coupled to the level shifting device configured to provide a first control signal and a second control signal, the second control signal being a complement of the first control signal;
- a first PMOS transistor configured to provide a first output signal when the first control signal is substantially equal to the reference potential; and
- a second PMOS transistor configured to provide a second output signal when the second control signal is substantially equal to the reference potential.

12. The apparatus of claim 11, wherein the level shifting device comprises:
- a summing circuit configured to combine the reference potential with the input signal to raise the minimum potential of the input signal to the reference potential and the maximum potential of the input signal to the second maximum potential.

13. The apparatus of claim 11, wherein the control logic generator comprises:
- a plurality of control logic generator cells including at least one standard logic cell configured to implement a binary algorithm.

14. The apparatus of claim 11, wherein the level shifting device comprises:
- a first inverting circuit, coupled to the second maximum potential and the reference potential, configured to translate the first maximum potential of the input signal to the second maximum potential and the minimum potential of the input signal to the reference potential; and
- a first transistor configured to cause the first inverting circuit to translate the first maximum potential of the input signal to the second maximum potential when the input signal is substantially equal to the first maximum potential.

15. The apparatus of claim 14, wherein the first transistor provides the minimum potential to the first inverting circuit when the input signal is substantially equal to the first maximum potential.

16. The apparatus of claim 14, wherein the level shifting device further comprises:
- a second inverting circuit, coupled the first maximum potential and the minimum potential, configured to translate the first maximum potential of the input signal to the minimum potential and the minimum potential of the input signal to the first maximum potential; and
- one or more second transistors arranged in circuit to cause the first inverting circuit to translate the minimum potential of the input signal to the reference potential when an output of the second inverting circuit is substantially equal to the first maximum potential.

17. The apparatus of claim 16, wherein the one or more second transistors comprise:
- a third transistor, coupled to the second inverting circuit, configured to provide the minimum potential when the output of the second inverting circuit is substantially equal to the first maximum potential; and
- a fourth transistor, coupled to the third transistor, configured to provide the second maximum potential to the first inverting circuit based when an output of the third is substantially equal to the minimum potential.

18. The apparatus of claim 11, wherein the control logic generator comprises:
- a first inverting circuit, coupled to the second maximum potential and the reference potential, configured to provide the second control signal based upon the level shifted input signal; and
- a second inverting circuit, coupled to the second maximum potential and the reference potential, configured to provide the first control signal based upon an output of the first inverting circuit.

19. The apparatus of claim 11, further comprising:
- a current source coupled to the second maximum potential to provide a current, wherein the first PMOS transistor provides the current as the first output signal when the control signal is substantially equal to the reference potential and the second PMOS provides the second output signal when the second control signal is substantially equal to the reference potential.

20. The apparatus of claim 1, wherein the second maximum potential is greater than the first maximum potential.

21. The apparatus of claim 11, wherein the second maximum potential is greater than the first maximum potential.

* * * * *

UNITED STATES PATENT AND TRADEMARK OFFICE
CERTIFICATE OF CORRECTION

PATENT NO. : 7,649,382 B2  Page 1 of 3
APPLICATION NO. : 11/586670
DATED : January 19, 2010
INVENTOR(S) : Hans Eberhart It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 0 days.

Column 4
Lines 15-31, please replace:
"Digital to analog converter control signal 152, explained in further detail below in FIG. 2B, is used by digital to analog converter current source array 104 to form 1 digital to analog converter output signal 154. Digital to analog converter output signal 154 is an analog signal generated by digital to analog converter current source array 104. Digital to analog converter output signal 154 can contain a dissimilar number of signals than digital to analog converter control signal 152. Varying numbers of digital to analog converter output signal 154 can be generated by a single digital to analog converter control signal 152. For example, for a digital to analog converter control signal 152.1, digital to analog converter current source array 104 can generate digital to analog output signals 154.1 and 154.2. As another example, for digital to analog converter control signal 152.1 and 152.2, digital to analog converter current source array 104 can generate digital to analog converter output signal 154.1 only.".
with
--FIG. 2B illustrates a graphical representation of a digital to analog converter control signal used in a conventional interface to drive a digital to analog converter current source array. As previously mentioned, control logic generator 102 uses input signal 150 to form digital to analog converter control signal 152. Graphical display 250 contains a time domain representation of a single signal from the collective digital to analog converter control signal 152. Digital to analog converter control signal 152 has a maximum potential of AVDD and a minimum potential of AVSS. Therefore, as demonstrated in graphic display 250, control logic generator amplifies input signal 150 by the difference between potential AVDD and potential DVDD to form digital to analog converter control signal 152. Similar graphical illustrations can be made for each signal comprising digital to analog converter control signal 152. Even though digital to analog converter control signal 152 is shown to have the same periodicity of input signal 150, digital to analog converter control signal 152 need not exhibit these characteristics. For example, if digital to analog converter control signal 152 is used to drive digital to analog converter current source array 104 requiring a complementary control signal, digital to analog converter control signal 152 can be phase shifted 180 degrees by control logic generator 102 to form a complementary representation of input signal 150. Therefore the periodic nature of digital to analog converter control signal 152, the number of periods of digital to analog converter control signal 152, and the correlation Signed and Sealed this Twenty-seventh Day of July, 2010

David J. Kappos
*Director of the United States Patent and Trademark Office* between digital to analog converter control signal 152 and input signal 150 as displayed are for illustrative purposes only; the actual values are neither required to display periodic tendencies nor correlate with the input signal.--.

Column 4
Line 38, please replace "signal 150 to." with --signal 150.--.

Column 4
Lines 61-63, please replace "can generate digital to analog converter control signal 352.1 and 352.2 level shifted input signals 350.1 and 350.2" with --can generate level shifted input signals 350.1 and 350.2--.

Column 4
Line 64 through line 12 in Column 5, please replace:
"FIG. 3 illustrates an interface used to drive a digital to analog converter current source array according to an embodiment of the present invention. Interface 300 contains level shifter 302, control logic generator 304, and digital to analog converter current source array 104. Level shifter 302 generates level shifted input signal 350 based upon input signal 150. Level shifted input signal 350 is then used by control logic generator 304 to form digital to analog converter control signal 352. Digital to analog converter current source array 104 uses digital to analog converter control signal 352 to form digital to analog converter output signal 154. Even though interface 300 depicts level shifter 302 and control logic generator 304 are coupled to a digital to analog converter current source array, those skilled in the arts will understand that any suitable device may be used in conjunction with level shifter 302 and control logic generator 304.".
with
--Control logic generator 304 transforms input signal 150 into j digital to analog converter control signals 352, denoted as 352.1 through 352.j. Digital to analog converter control signal 352 is explained in further detail below in FIG. 4C. Digital to analog converter control signal 352 can contain a dissimilar number of signals than level shifted input signal 350. Multiple digital to analog converter control signals 352 can be generated from a single level shifted input signal 350, or a single digital to analog converter control signal can be generated from numerous level shifted input signals 350. For example, for a level shifted input signal 350.1, control logic generator 102 can generate digital to analog converter control signals 352.1, and 352.2. As another example, for level shifted input signals 350.1 and 350.2, control logic generator 102 can generate digital to analog converter control signal 352.1 only.--.

Column 5
Lines 44-60, please replace:
"Digital to analog converter control signal 352 is used by digital to analog converter current source array 104 to form l digital to analog converter output signals 154. Digital to analog converter output signal 154 is an analog signal generated by digital to analog converter current source array 104 according to digital to analog converter control signal 352. Digital to analog converter output signal 154 can contain a dissimilar number of signals than digital to analog converter control signal 352. Varying numbers of digital to analog converter output signal 154 can be generated by a single digital to analog converter control signal 352. For example, for a digital to analog converter control signal 352.1, digital to analog converter current source array 104 can generate digital to analog output signals 154.1 and 154.2. As another example, for digital to analog converter control signal 352.1 and 352.2, digital to analog converter current source array 104 can generate digital to analog converter output signal 154.1 only.".

with

--FIG. 4B illustrates a graphical representation of a level shifted input signal to drive a control logic generator according to an embodiment of the present invention. As previously mentioned, level shifter 302 operates upon input signal 150 to form level shifted input signal 350. Graphical display 425 contains a time domain representation of a single signal comprising level shifted input signal 350. Level shifted input signal 350 has a maximum potential of AVDD and minimum potential corresponding to difference between AVDD and DVDD. Therefore, as demonstrated in graphic display 425, level shifter 302 forms level shifted input signal 350 by shifting the minimum potential of input signal 150 to the difference between potential AVDD and potential DVDD and shifting the maximum potential of input signal 150 from DVDD to AVDD. Similar graphical illustrations can be made for each signal comprising level shifted input signal 350. The periodic nature of level shifted input signal 350 and the number of periods of level shifted input signal 350 displayed are for illustrative purposes only; the actual values are not required to be periodic in nature.--.

Column 13
Line 36, please replace "device including a reference potential," with --device, including a reference potential,--.